(12) United States Patent
Block et al.

(10) Patent No.: US 7,514,974 B2
(45) Date of Patent: Apr. 7, 2009

(54) METHOD AND APPARATUS FOR ADJUSTING ON-CHIP DELAY WITH POWER SUPPLY CONTROL

(75) Inventors: Stefan G. Block, Munich (DE); Stephan Habel, Berg (DE)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/736,931

(22) Filed: Apr. 18, 2007

(65) Prior Publication Data
US 2008/0258700 A1    Oct. 23, 2008

(51) Int. Cl.
*H03L 7/00* (2006.01)
(52) U.S. Cl. .................... 327/161; 327/162
(58) Field of Classification Search .......... None
See application file for complete search history.

(56) References Cited

U.S. PATENT DOCUMENTS

| | | | |
|---|---|---|---|
| 6,373,314 B2 * | 4/2002 | Oda | 327/291 |
| 6,476,656 B2 * | 11/2002 | Dally et al. | 327/276 |
| 6,930,521 B2 * | 8/2005 | Wald | 327/147 |
| 7,075,276 B2 * | 7/2006 | Morales | 323/246 |
| 7,148,755 B2 * | 12/2006 | Naffziger et al. | 331/16 |

* cited by examiner

*Primary Examiner*—Cassandra Cox
(74) *Attorney, Agent, or Firm*—Westman, Champlin & Kelly, P.A.

(57) ABSTRACT

An apparatus and method are provided for powering an integrated circuit chip with a supply voltage generated externally to the chip. An on-chip clock signal is generated with a ring oscillator fabricated on the integrated circuit chip. The supply voltage is altered as a function of a difference between a frequency of the on-chip clock signal and a reference clock frequency.

18 Claims, 3 Drawing Sheets

METHOD AND APPARATUS FOR ADJUSTING ON-CHIP DELAY WITH POWER SUPPLY CONTROL

FIELD OF THE DISCLOSURE

The present disclosure relates to electrical circuits, such as semiconductor integrated circuits. More particularly, the present disclosure relates to changes in on-chip delays due to changes in process, voltage and temperature of the chip.

BACKGROUND OF THE INVENTION

Semiconductor integrated circuits often incorporate hundreds of thousands of semiconductor elements on a single chip. These elements are interconnected to perform a desired function.

Changes in process, voltage and/or temperature (PVT) of an integrated circuit chip can cause changes in propagation delays through the elements of the circuit. These changes can therefore have a direct negative impact on the timing margin of a particular design and can affect its functional operation.

For example, integrated circuits typically have one or more interfaces for communicating with other devices. Some integrated circuits incorporate high speed interfaces, which usually have a clock recovery unit or a delay line of some kind that is adapted to adjust for changes in delays, such as on-chip delays or on-board delays, due to changes in process and factors.

Certain interfaces, which are mainly chip-to-chip interfaces on the same board, are defined to be source-synchronous interfaces. These types of interfaces typically do not have a clock/data recovery unit, but rather latch the received data using the synchronous clock that is provided with the data from the transmitter side of the interface. A fixed delay is used to shift the received clock signal so that the shifted clock transitions in the middle of the data eye and can therefore be used to latch the data. However, the fixed delay can introduce a certain level of uncertainty since under worst-case process, voltage and/or temperature (PVT) conditions, the fixed delay can be different (e.g., longer) than under best case conditions. Therefore, it can become difficult to design high speed interfaces with a large timing margin.

Preferably, delays should remain constant from one integrated circuit to the next and over changes in the fabrication process and in operating conditions such as operating voltage and temperature. A constant delay can provide a larger timing margin.

Improved methods and apparatus are desired for compensating changes in delays caused by changes in process, voltage and/or temperature of an integrated circuit chip.

SUMMARY

An aspect of the present disclosure is directed to an apparatus. The apparatus includes an integrated circuit chip, a clock source and a voltage regulator. The chip includes a ring oscillator with a clock output. The clock source provides a reference clock. The voltage regulator, which is external to the integrated circuit chip, provides the chip with a supply voltage having a level based on a control signal. A comparator circuit supplies the control signal to the voltage regulator based on a comparison between a frequency of the clock output and a frequency of the reference clock.

Another aspect of the present disclosure is directed to a method, which includes: powering an integrated circuit chip with a supply voltage generated externally to the chip; generating an on-chip clock signal with a ring oscillator fabricated on the integrated circuit chip; and altering the supply voltage as a function of a difference between a frequency of the on-chip clock signal and a reference clock frequency.

DETAILED DESCRIPTION OF ILLUSTRATIVE EMBODIMENTS

Figure 1:
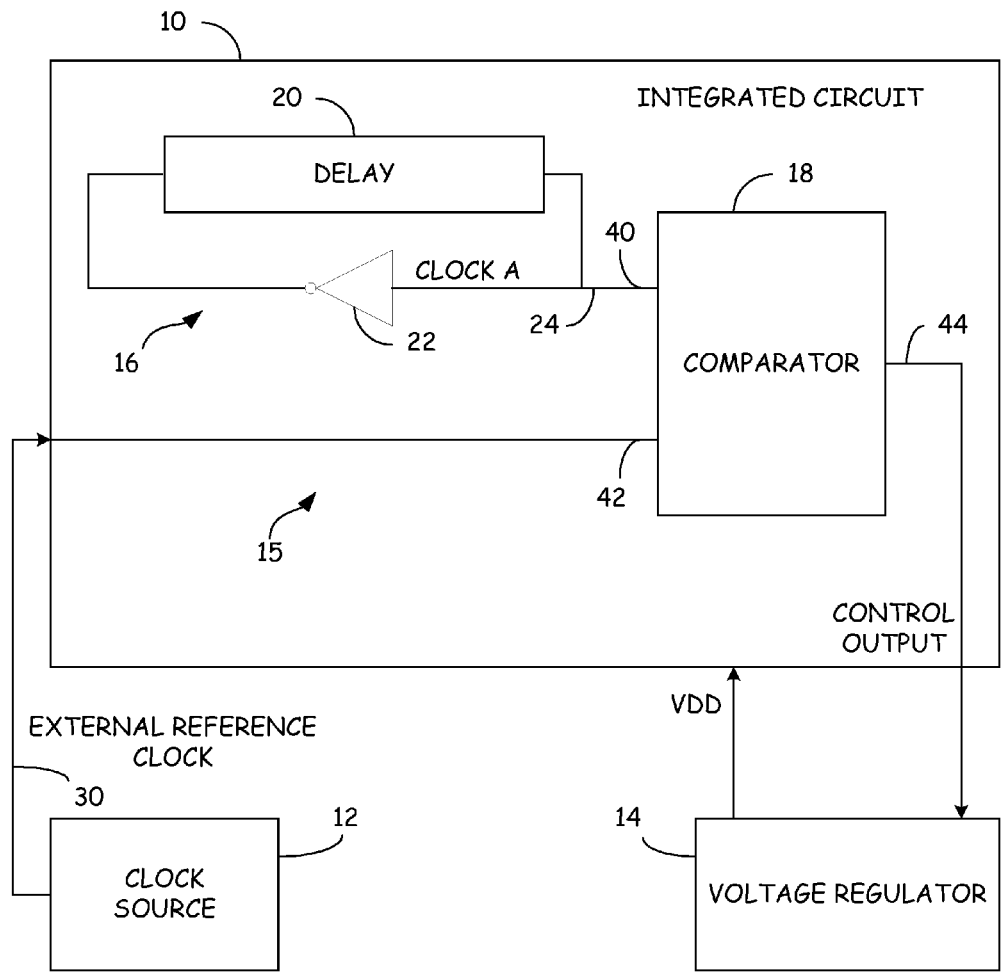
FIG. 1 is a block diagram, which illustrates an example of a system for adjusting delays on an integrated circuit by controlling a supply voltage applied to the integrated circuit.

FIG. 1 is a block diagram illustrating a method and apparatus for adjusting on-chip delay with a power supply control, according to an exemplary embodiment of the disclosure. The apparatus includes a semiconductor integrated circuit chip 10, a clock source 12 and a voltage regulator 14. Voltage regulator 14 provides a chip supply voltage (VDD) to integrated circuit chip 10, which powers at least a portion of chip 10.

Integrated circuit chip 10 includes a digital on-chip delay measurement circuit 15, which includes a ring oscillator 16 and a comparator 18. Ring oscillator 16 includes a delay line 20, an inverter 22 and a clock output 24 (labeled CLOCK A). Delay line 20 and inverter 22 are coupled in a ring such that CLOCK A oscillates. The frequency of oscillation depends on the propagation delay through delay line 20. Comparator 18 compares this frequency to a reference frequency provided by clock source 12.

Changes in process, voltage and/or temperature (PVT) of integrated circuit chip 10 can cause changes in the propagation delay and therefore the oscillation frequency of CLOCK A. Measurement circuit 15 measures changes in the propagation delay through delay line 20 by measuring changes in the oscillation frequency of CLOCK A. The measurement allows these changes to be compensated and thereby provide a more controlled delay and thus the required timing margin will be reduced for functional blocks that are implemented on integrated circuit chip 10.

Clock source 12 supplies an external reference clock 30 to integrated circuit chip 10. Preferably, reference clock signal 30 has a frequency that is substantially independent of changes in process, voltage and temperature of integrated circuit chip 10. In one example, clock source 12 includes a crystal oscillator that provides a substantially constant reference frequency. However, other types of clock sources can be used in alternative embodiments. In some embodiments clock source 12 can be implemented within integrated circuit chip 10. However, in many embodiments it is desirable to use an external clock source such that changes in process, voltage and temperature of the integrated circuit chip do not affect the reference clock frequency.

The clock output 24 from ring oscillator 16 is coupled to a first input 40 of comparator 18, and the external reference clock 30 is coupled to a second input 42 of comparator 18. Comparator 18 compares the frequency of reference clock 30 with the ring oscillator frequency and generates a voltage control output 44 as a function of the difference. Under a nominal process condition, a nominal voltage condition and a worst-case temperature condition, the two frequencies should be substantially identical, within a certain margin of error.

If the propagation delay through delay line 20 is too slow, the oscillation frequency of CLOCK A will be less than the oscillation frequency of reference clock 30, and comparator 18 generates a signal on voltage control output 44 that causes voltage regulator 14 to increase the chip supply voltage (VDD) supplied to integrated circuit chip 10. Voltage control output 44 can be implemented in any manner, such as a digital control signal or an analog control signal. By increasing the supply voltage, the core voltage within the core of integrated circuit chip 10 will increase, resulting in a reduction in propagation delay through the semiconductor elements on the chip that are powered by that supply voltage. Hence, the on-chip oscillator frequency increases and thus the frequency of CLOCK A increases toward the reference frequency.

If the propagation delay through delay line 20 is too small, such that the oscillation frequency of CLOCK A is greater than the oscillation frequency of reference clock 30, comparator 18 generates a signal on voltage control output 44 that causes voltage regulator 14 to decrease supply voltage VDD. As the supply voltage VDD decreases, the propagation delays through the semiconductor elements on integrated circuit chip 10 increases. As a result, the frequency of CLOCK A reduces toward the reference frequency.

In an exemplary embodiment, voltage regulator 14 is implemented external to integrated circuit chip 10 such that changes in the process, voltage and temperature of integrated circuit 10 do not affect the voltage supplied by the voltage regulator. Also, if the voltage regulator were implemented on the integrated circuit, changes in the operating state of voltage regulator 14 could cause changes in the operating temperature of integrated circuit 10. However in alternative embodiments, voltage regulator 14 can be implemented in whole or in part on integrated circuit chip 10.

On-chip delay measurement circuit 15 as shown in FIG. 1 can have several benefits. First, the circuit can compensate for changes in the fabrication process of integrated circuit chip 10. If integrated circuit chip 10 has a worst-case process condition, ring oscillator 16 will oscillate slower rather than the reference frequency. In this case, measurement circuit 15 increases the chip supply voltage to compensate the slow (worst-case) process condition.

Second, measurement circuit 15 can provide integrated circuit chip 10 with reduced power consumption. If integrated circuit 10 has a best-case process condition, then ring oscillator 16 will oscillate faster than the reference frequency. In this case, measurement circuit 15 decreases the chip supply voltage, which reduces the power-dissipation of the chip, which also helps to control the chip temperature.

Third, measurement circuit 15 compensates for changes in delay caused by increasing chip temperature. When integrated circuit chip 10 powers-up, the chip is usually cold initially. When the chip is cold, the oscillation frequency of CLOCK A is faster than the reference clock frequency. The chip supply voltage can therefore be reduced during initial power-up. During operation, the chip temperature increases, resulting in an increasing gate delay. As the propagation delay through delay line 20 increases, the oscillation frequency of CLOCK A reduces relative to the reference clock frequency. The chip supply voltage can then be increased to compensate for the increase in delay caused by the increasing chip temperature. The on-chip delay measurement circuit therefore allows the chip supply voltage to be controlled to compensate for changes in delays caused by changes in the chip process and chip temperature.

Figure 2:
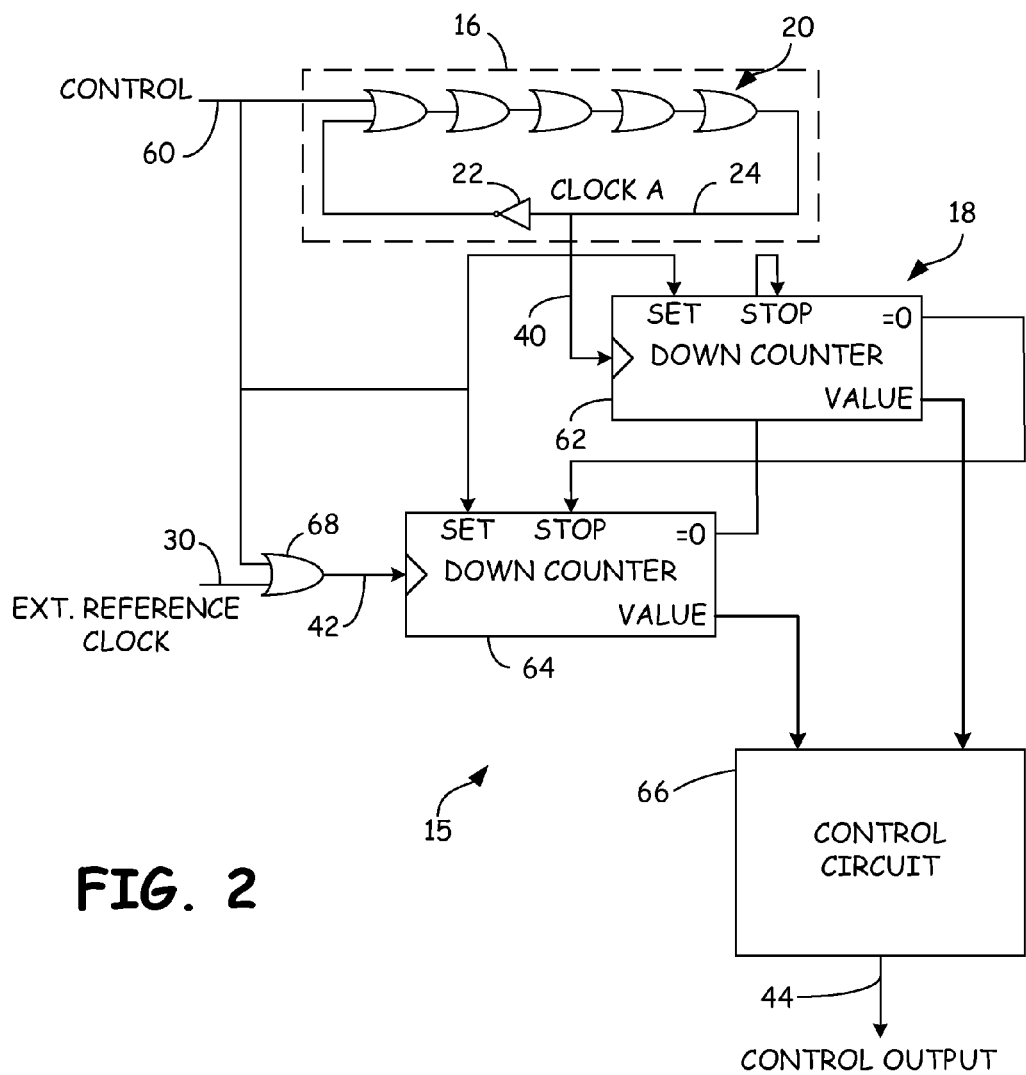
FIG. 2 is a block diagram, which illustrates an example of a measurement circuit within the system shown in FIG. 1.

FIG. 2 is a diagram illustrating on-chip delay measurement circuit 15 in greater detail according to an exemplary embodiment. Measurement circuit 15 includes a control input 60, which selectively activates the circuit and sets ring oscillator 16 and comparator 18 to predetermined states. Control input 60 can activate measurement circuit 15 under any suitable condition, such as in response to a power-on-reset or a new reset, at a predetermined interval, or at any time a new measurement is desired.

In the normal operating state, control input 60 has a logic high state. The logic high state sets the first delay element of oscillator 16 (and/or any other element of the oscillator) to a predetermined state and prevents the oscillator from oscillating. To perform a new measurement, control input 60 is set to a logic low state, which allows oscillator 16 to oscillate and allows reference clock 30 to pass through logic-OR gate 68 such that the chip supply voltage can be adjusted accordingly. The measurement time is relatively short, and control input 60 normally inactivates measurement circuit 15 to avoid consuming power through the oscillator.

In this embodiment, ring oscillator 16 includes a delay line 20 formed by a plurality of logic-OR gates, which are connected in series with one another. Any suitable number of delay elements or gates can be used. Also, any other type or types of delay elements can be used in alternative embodiment, such as logic-AND gates, buffers and/or inverters.

Comparator 18 includes down-counters 62 and 64 and a control circuit 66. Each counter has a clock input, a SET input, a STOP input, a zero-count output (=0), and a count VALUE output. The clock input to down-counter 62 forms the first comparator input 40 and is coupled to the ring oscillator output, CLOCK A. The SET input of down-counter 62 is coupled to control input 60. The STOP input of counter 62 is coupled to the zero-count output (=0) of down-counter 64, and the zero-count output (=0) of counter 62 is coupled to the STOP input of counter 64. The VALUE output of counter 62 is coupled to control circuit 66.

The clock input of down-counter 64 forms the second comparator input 42 and is coupled to the output of LOGIC-OR gate 68 for receiving the external reference clock 30 when control input 60 is inactive. The SET input of counter 64 is coupled to control input 60. The count VALUE output of counter 64 is coupled to control circuit 66.

During operation, when control input 60 is set to an activate state, logic-OR gate 68 blocks the external reference clock 30 and sets down-counters 62 and 64 to predetermined count values. In an exemplary embodiment, down-counters 62 and 64 are substantially similar to one another and are set to the same initial count (for example). When control input 60 becomes inactive, external reference clock 30 is applied to the clock input of counter 64, which begins counting down from the initial count value. Similarly, CLOCK A begins oscillating, causing down-counter 62, to begin counting down from the same initial count. When either counter 62 or counter 64 reaches a zero count (or any other predetermined value), that counter activates its zero output (=0), thereby stopping the other counter.

Each counter 62 and 64 outputs its present count value on its VALUE output, and control circuit 66 compares the two values. Control circuit 66 generates control output 44 as a function of the difference in count values. Since one count value is zero, control circuit 66 can generate control output 44 based on which count value is non-zero. However in an alternative embodiment, control circuit 66 can compare the two count values, for example.

In one embodiment, control output 44 indicates whether one value is greater than or less than the other value. In this example, control output 44 can be used by voltage regulator 14 as a signal to increment or decrement the chip supply voltage level by a predetermined amount, for example, to progressively move the ring oscillator frequency toward the reference frequency. In another embodiment, control output 44 can represent which count value is greater and the magnitude of the difference. In this embodiment, voltage regulator 14 adjusts the chip supply voltage level by an amount representative of the magnitude of the count difference, for example. Other methods and control functions for adjusting the chip supply voltage can also be used.

Comparator 18 is simply one example of a comparator that can be used as part of on-chip measurement circuit 15. Other types and methods of measuring and/or comparing two or more clock frequencies can be used in alternative embodiments. For example, counters 62 and 64 can be implemented as up-counters, rather than down-counters. Also, many different methods can be used for triggering the various counters, the control circuit and the voltage regulator. In a further embodiment, one or more of the elements of measurement circuit 15 can be implemented external to integrated circuit 10 (shown in FIG. 1). For example, counters 62 and 64 and control circuit 66 can be implemented off-chip.

The system shown in FIGS. 1 and 2 can be self-adjusting. Control circuit 66 and voltage regulator 14 can be configured to supply chip 10 with a nominal external reference voltage, such as 1.0 Volts. When the two frequencies are compared, if the ring oscillator frequency is higher than the reference frequency, control circuit 66 can generate control output 44 so as to decrease the chip supply voltage by a predetermined amount, such as by 0.01 Volts, such that the chip supply voltage becomes 0.99 Volts. Measurement circuit 15 again measures the two frequencies and if the internal ring oscillator frequency remains higher than the reference frequency, control circuit 66 again decreases the external voltage by a predetermined amount, to 0.98 Volts. This process continues until the internal ring oscillator frequency is lower than or within a specified range of the external reference frequency or until the chip voltage reaches a predetermined minimum voltage bound.

If the internal ring oscillator frequency is lower then the external reference frequency, control circuit 66 increases the chip voltage by a predetermined amount. The chip supply voltage can be progressively increased until the voltage reaches a predetermined maximum voltage bound or until the internal ring oscillator frequency is greater than or within a predetermined range of the external reference frequency. The process works similarly in both directions and provides a self-adjusting system that does not require trimming or silicon characterization. However, the system shown in FIGS. 1 and 2 can be modified if desired to include trimming. In this case, the silicon can be characterized to determine how much the external chip voltage needs to be incremented or decremented for a certain frequency difference.

Figure 3:
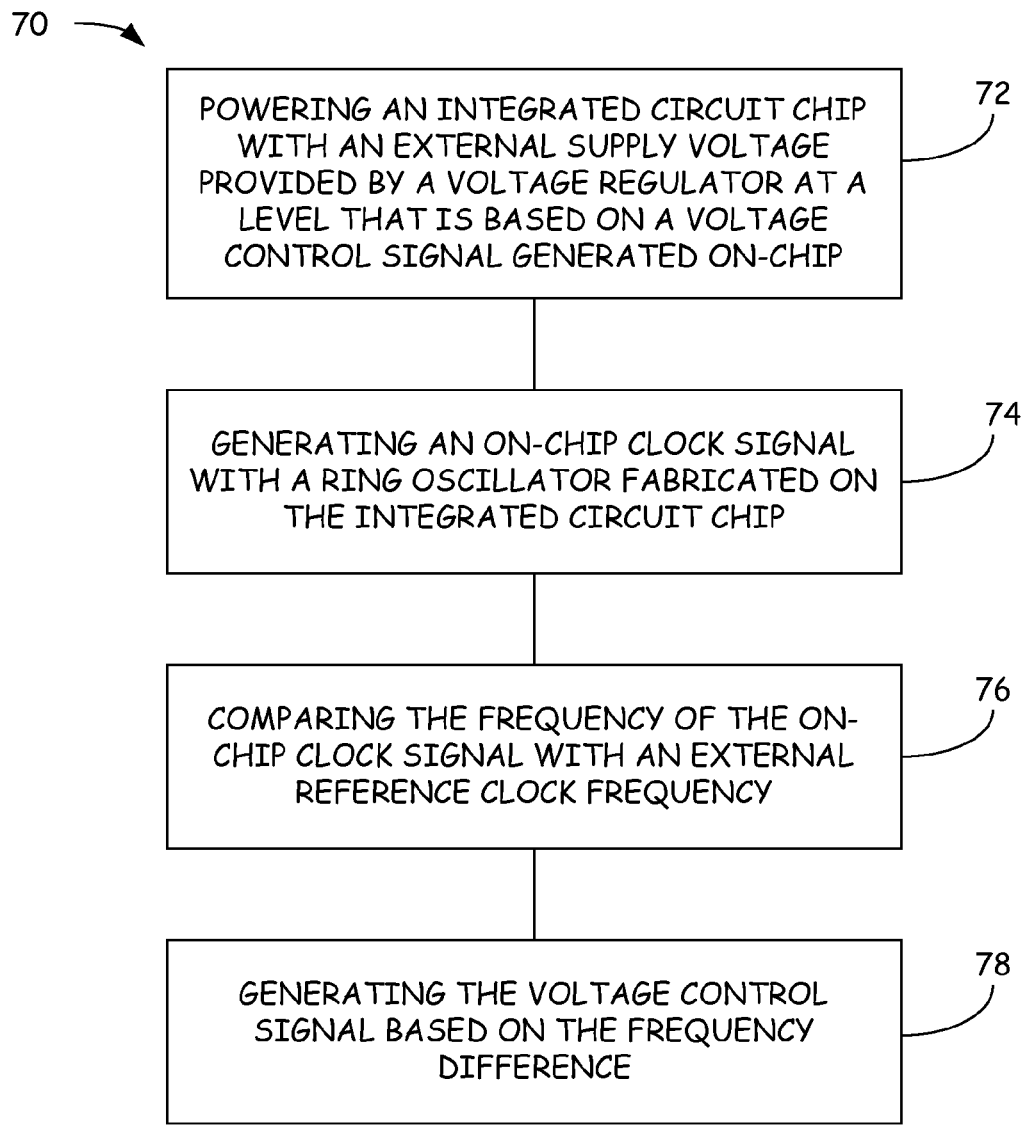
FIG. 3 is a flow chart illustrating a method for adjusting delays on an integrated circuit by controlling a supply voltage applied to the integrated circuit.

FIG. 3 is a flow chart illustrating a method 70 for adjusting delays on an integrated circuit by controlling a supply voltage applied to the integrated circuit as described above, for example. Method 70 includes a step 72 of powering an integrated circuit chip with a supply voltage provided by a voltage regulator at a level that is based on a voltage control signal. At step 74, an on-chip clock signal is generated with a ring oscillator fabricated on the integrated circuit chip. At step 76, the frequency of the on-chip clock signal is compared with a reference clock frequency, and at step 78, the voltage control signal is generated based on the difference.

Integrated circuit 10 (shown in FIG. 1) can include any number of on-chip delay measurement circuits 15. A single measurement circuit 15 can be used to compensate for changes in PVT for the entire integrated circuit chip. Alternatively, multiple measurement circuits 15 can be used to measure changes in delay in different regions of the chip to control on-chip variation or to provide multiple measurements. For example, for a rectangular die, a ring oscillator can be located in each corner of the die and a further ring oscillator can be located near the center of the die. This would allow for compensation of on-chip variation, for example. The results of multiple, independent measurements can be combined to control a single voltage regulator or can be used separately to control respective voltage regulators that power respective portions of the die, for example.

The above system and method for measuring and compensating on-chip delays can be used to improve the timing margin of a variety of different integrated circuit functions. For example and not by limitation, the above system and method can be used for improving timing margin in source synchronous high-speed interfaces. Source synchronous interfaces are used in a variety of applications, such as serializer/deserializer (SERDES) circuits. Source synchronous interfaces provide a clock signal with the data from the transmitter side of the interface. The clock signal is used to latch the data at the receiver side of the interface. A fixed delay is used to shift the received clock signal to produce shifted clock transitions within the middle of the data eye that can be used to latch the data. Changes in PVT can therefore have a great affect on the magnitude of the fixed delay and the resulting timing margin of the receiver. Compensating on-chip delays for changes in process and temperature can therefore provide improved timing margin for source-synchronous receivers. Since source-synchronous receivers are highly process dependent, compensation for changes in process can reduce changes in the fixed delay that is used to latch data. With a wider timing margin, the complexity of designing the interface circuit reduces significantly.

Although the present disclosure has been described with reference to one or more embodiments, workers skilled in the art will recognize that changes may be made in form and detail without departing from the disclosure or the appended claims.

What is claimed is:

1. An apparatus comprising:
   an integrated circuit chip comprising a ring oscillator having a clock output;
   a clock source, which provides a reference clock;
   a voltage regulator, which is external to the integrated circuit chip and provides the chip with a supply voltage having a level based on a control signal; and
   a comparator circuit, which supplies the control signal to the voltage regulator based on a comparison between a frequency of the clock output and a frequency of the reference clock, the comparator circuit comprising:
      a first counter, which generates a first count as a function of the clock output frequency;
      a second counter, which generates a second count as a function of the reference clock frequency; and
      a control circuit, which generates the control signal based on the first and second counts, and wherein at least one of the first or second counters is coupled to stop the other of the first or second counters from counting upon the respective first or second count reaching a predetermined count.

2. The apparatus of claim 1, wherein the frequency at which the clock source supplies the reference clock is substantially independent of changes in at least one of a process or a temperature of the integrated circuit chip.

3. The apparatus of claim 1, wherein the clock source is external to the integrated circuit chip.

4. The apparatus of claim 1, wherein the clock source comprises a crystal oscillator.

5. The apparatus of claim 1, wherein the comparator is implemented within the integrated circuit chip.

6. The apparatus of claim 1, wherein:
the first and second counters are set to initial counts;
the first counter is coupled to stop the second counter from counting upon the first counter reaching a first predetermined count; and
the second counter is coupled to stop the first counter from counting upon the second counter reaching a second predetermined count.

7. The apparatus of claim 1, wherein the control circuit is adapted to perform a sequence of frequency measurements, wherein with each measurement the control circuit alters the control signal supplied to the voltage regulator such that the voltage regulator incrementally changes the supply voltage in a single direction until the supply voltage reaches a bound value or the clock output frequency reaches a predetermined range relative to the reference clock frequency.

8. The apparatus of claim 1, wherein the integrated circuit chip comprises a plurality of ring oscillators and comparator circuits, each oscillator providing a respective comparator circuit with a respective clock output.

9. A method comprising:
powering an integrated circuit chip with a supply voltage generated externally to the chip;
generating an on-chip clock signal with a ring oscillator fabricated on the integrated circuit chip;
generating a first count as a function of a frequency of the on-chip clock signal;
generating a second count as a function of a frequency of a reference clock, and further comprising stopping at least one of the first or second counts upon the other of the first or second count reaching a predetermined count;
generating a voltage control signal based on the first and second counts: and
altering the supply voltage as a function of the voltage control signal, which represents a difference between a frequency of the on-chip clock signal and the reference clock frequency.

10. The method of claim 9, wherein the step of powering comprises generating the supply voltage with an external voltage regulator, which provides the supply voltage at a level based on the control signal.

11. The method of claim 10 and further comprising:
generating the control signal on the integrated circuit chip as a function of the difference between the on-chip clock signal frequency and the reference clock frequency.

12. The method of claim 9 and further comprising:
generating the reference clock frequency substantially independent of changes in at least one of a process or a temperature of the integrated circuit chip.

13. The method of claim 9 and further comprising:
generating the reference clock at the reference clock frequency externally to the integrated circuit chip and supplying the reference clock signal to the integrated circuit chip.

14. The method of claim 9 and further comprising:
generating the reference clock with a crystal oscillator externally to the integrated circuit chip.

15. The method of claim 9 and further comprising:
comparing the on-chip clock signal frequency with the reference clock frequency on the integrated circuit chip and generating the voltage control signal based on the difference; and
supplying the voltage control signal to a voltage regulator that is external to the integrated circuit chip and provides the supply voltage at a level that is based on the voltage control signal.

16. The method of claim 9 and further comprising:
setting the first and second counts to initial counts;
stopping the second count from counting upon the first count reaching a first predetermined count; and
stopping the first count from counting upon the second count reaching a second predetermined count.

17. The method of claim 9 wherein the step of altering comprises: comparing the on-chip clock signal frequency with the reference clock frequency;
altering the supply voltage as a function of the difference; and
repeating the steps of comparing and altering until the supply voltage reaches a bound value or the on-chip clock signal frequency reaches a predetermined range relative to the reference clock frequency.

18. The method of claim 9 and further comprising:
generating a plurality of on-chip clock signals with a plurality of ring oscillators fabricated in different regions of the integrated circuit chip; and
altering the supply voltage as a function of a difference between a frequency of at least one of the on-chip clock signals and a reference clock frequency.

* * * * *